(12) United States Patent
Bemmerl et al.

(10) Patent No.: US 11,869,865 B2
(45) Date of Patent: *Jan. 9, 2024

(54) SEMICONDUCTOR DEVICE HAVING A CONTACT CLIP WITH A CONTACT REGION HAVING A CONVEX SHAPE AND METHOD FOR FABRICATING THEREOF

(71) Applicant: Infineon Technologies AG, Neubiberg (DE)

(72) Inventors: Thomas Bemmerl, Schwandorf (DE); Chooi Mei Chong, Melaka (MY); Edward Myers, Unterhaching (DE); Michael Stadler, Munich (DE)

(73) Assignee: Infineon Technologies AG, Neubiberg (DE)

(*) Notice: Subject to any disclaimer, the term of this patent is extended or adjusted under 35 U.S.C. 154(b) by 216 days.

This patent is subject to a terminal disclaimer.

(21) Appl. No.: 17/389,721

(22) Filed: Jul. 30, 2021

(65) Prior Publication Data

US 2021/0358877 A1 Nov. 18, 2021

Related U.S. Application Data

(63) Continuation of application No. 16/695,866, filed on Nov. 26, 2019, now Pat. No. 11,088,105.

(30) Foreign Application Priority Data

Nov. 28, 2018 (DE) .......................... 102018130147.2

(51) Int. Cl.
*H01L 23/00* (2006.01)

(52) U.S. Cl.
CPC .............. *H01L 24/37* (2013.01); *H01L 24/84* (2013.01); *H01L 2224/37012* (2013.01);
(Continued)

(58) Field of Classification Search
CPC ................. H01L 24/37; H01L 24/3701; H01L 2224/37012–37013; H01L 24/40;
(Continued)

(56) References Cited

U.S. PATENT DOCUMENTS 4,935,803 A 6/1990 Kalfus et al.
5,001,545 A 3/1991 Kalfus et al.
(Continued)

FOREIGN PATENT DOCUMENTS

DE 68926645 T2 1/1997

*Primary Examiner* — Amar Movva
(74) *Attorney, Agent, or Firm* — Murphy, Bilak & Homiller, PLLC

(57) ABSTRACT

A semiconductor device includes: a carrier having a die pad and a contact; a semiconductor die having opposing first and second main sides and being attached to the die pad by a first solder joint such that the second main side faces the die pad; and a contact clip having a first contact region and a second contact region. The first contact is attached to the first main side by a second solder joint. The second contact region is attached to the contact by a third solder joint. The first contact region has a convex shape facing towards the first main side such that a distance between the first main side and the first contact region increases from a base of the convex shape towards an edge of the first contact region. The base runs along a line that is substantially perpendicular to a longitudinal axis of the contact clip.

7 Claims, 5 Drawing Sheets

(52) U.S. Cl.
CPC .............. *H01L 2224/84345* (2013.01); *H01L 2224/84815* (2013.01); *H01L 2924/3656* (2013.01)

(58) Field of Classification Search
CPC . H01L 2224/4005–40095; H01L 2224/71–72; H01L 2224/90; H01L 24/71–72; H01L 24/90

See application file for complete search history.

(56) References Cited

U.S. PATENT DOCUMENTS

| | | |
|---|---|---|
| 6,166,434 A | 12/2000 | Desai et al. |
| 7,663,211 B2 | 2/2010 | Noquil et al. |
| 9,281,270 B2 | 3/2016 | Geinitz et al. |
| 11,088,105 B2 | 8/2021 | Bemmerl et al. |
| 2010/0072585 A1 | 3/2010 | Shi et al. |
| 2014/0117523 A1 | 5/2014 | Ho et al. |
| 2022/0189855 A1 | 6/2022 | Feuerbaum et al. |

SEMICONDUCTOR DEVICE HAVING A CONTACT CLIP WITH A CONTACT REGION HAVING A CONVEX SHAPE AND METHOD FOR FABRICATING THEREOF

TECHNICAL FIELD

This disclosure relates in general to a semiconductor device and a method for fabricating a semiconductor device.

BACKGROUND

A semiconductor device may comprise a carrier, a semiconductor die and a contact clip that is configured to electrically couple an electrode on an upper side of the semiconductor die to a contact of the semiconductor device, e.g. a fused lead. The semiconductor die may be electrically and mechanically coupled to the carrier by a solder joint. Likewise, the contact clip may be electrically and mechanically coupled to the upper side of the semiconductor die and to the contact by further solder joints. Due to manufacturing tolerances, solder joints may be fabricated which fail to fulfill the intended specifications (i.e. solder joints may be fabricated that are e.g. uneven or that comprise voids). Such "imperfect" solder joints may be prone to electrical and/or mechanical failures. Improved fabrication methods and/or improved contact clip geometries may help to overcome these problems.

SUMMARY

Various aspects pertain to a semiconductor device comprising a carrier comprising a die pad and a contact, a semiconductor die comprising a first main side and an opposing second main side, the semiconductor die being attached to the die pad by a first solder joint such that the second main side faces the die pad and a contact clip comprising a first contact region and a second contact region, the first contact region being attached to the first main side of the semiconductor die by a second solder joint and the second contact region being attached to the contact by a third solder joint, wherein the first contact region has a convex shape facing towards the first main side of the semiconductor die such that a distance between the first main side and the first contact region increases from a base of the convex shape towards an edge of the first contact region and wherein the base runs along a line that is substantially perpendicular to a longitudinal axis of the contact clip.

Various aspects pertain to a method for fabricating a semiconductor device, the method comprising: providing a carrier comprising a die pad and a contact, depositing a first solder deposit on the die pad and depositing a third solder deposit on the contact, arranging a semiconductor die comprising a first main side and an opposing second main side on the first solder deposit such that the second main side faces the die pad, depositing a second solder deposit on the first main side of the semiconductor die, arranging a contact clip comprising a first contact region and a second contact region over the semiconductor die such that the first contact region contacts the second solder deposit and the second contact region contacts the third solder deposit and soldering the first, second and third solder deposits, wherein the first contact region has a convex shape facing towards the first main side of the semiconductor die such that a distance between the first main side and the first contact region increases from a base of the convex shape towards an edge of the first contact region and wherein the base runs along a line that is substantially perpendicular to a longitudinal axis of the contact clip.

BRIEF DESCRIPTION OF THE DRAWINGS

The accompanying drawings illustrate examples and together with the description serve to explain principles of the disclosure. Other examples and many of the intended advantages of the disclosure will be readily appreciated as they become better understood by reference to the following detailed description. The elements of the drawings are not necessarily to scale relative to each other. Like reference numerals designate corresponding similar parts.

DETAILED DESCRIPTION

The semiconductor die(s) mentioned below can be manufactured from specific semiconductor material, for example Si, SiC, SiGe, GaAs, GaN, or from any other semiconductor material. The semiconductor die(s) may realize different kinds of circuits, among them power MOS transistors, power Schottky diodes, JFETs (Junction Gate Field Effect Transistors), power bipolar transistors, logic integrated circuits, analogue integrated circuits, power integrated circuits, etc. The semiconductor die(s) may also comprise MOS transistor structures or vertical transistor structures like, for example, IGBT (Insulated Gate Bipolar Transistor) structures.

The semiconductor die(s) may be bonded to a carrier. The carrier may be a (permanent) device carrier used for packaging. The carrier may comprise or consist of any sort of material as, for example, ceramic or metallic material, copper or copper alloy or iron/nickel alloy. The carrier can be connected mechanically and electrically with one contact element of the semiconductor die(s). The semiconductor die(s) can be connected to the carrier by one or more of reflow soldering, vacuum soldering, diffusion soldering, or adhering by means of a conductive adhesive.

The contact clip described below comprise or consist of any suitable electrically conductive material, for example a metal like Al, Cu or Fe or a metal alloy. The contact clip may for example be manufactured using a stamping process or a pressing process.

Figure 1A:
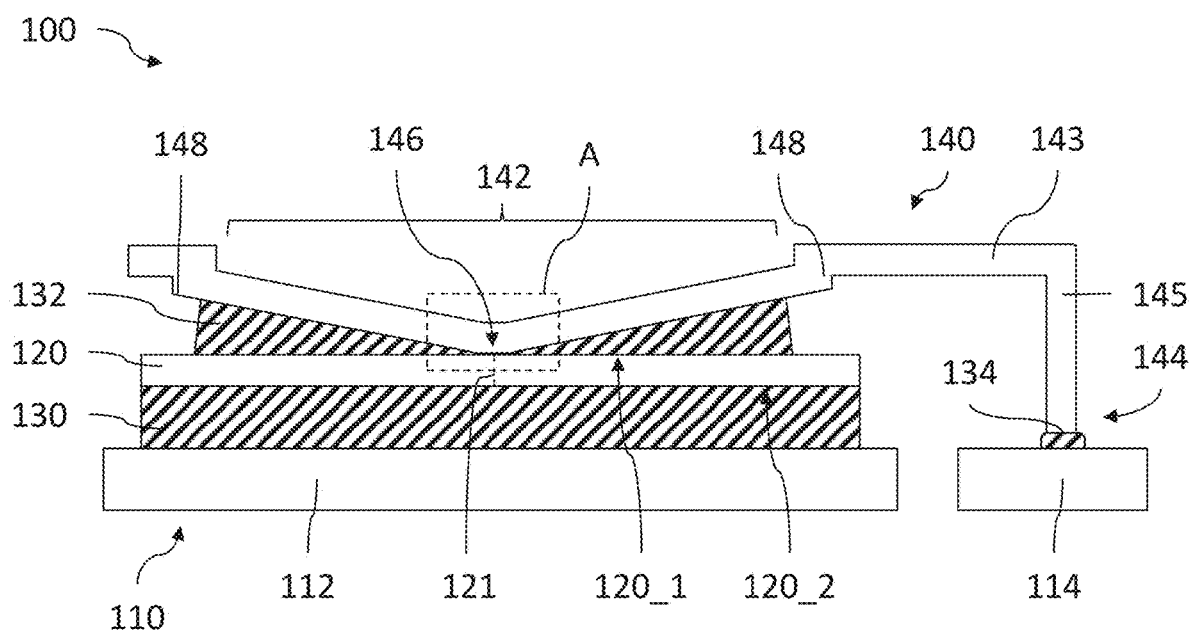
FIG. 1A shows a side view of a first example of a semiconductor device.

FIG. 1A shows a side view of a first example of a semiconductor device 100. The semiconductor device 100 comprises a carrier 110 comprising a die pad 112 and a contact 114. The contact 114 may e.g. comprise a "fused lead". A semiconductor die 120 comprising a first main side 120_1 and a second main side 120_2 opposite the first main side 120_1 is arranged over the die pad 112 and is attached to the die pad 112 by a first solder joint 130. Arranged over the semiconductor die 120 is a contact clip 140 which comprises a first contact region 142 and a second contact region 144. The contact clip 140 is attached to the semiconductor die 120 by a second solder joint 132 arranged between the first contact region 142 and the first main side 120_1. The contact clip is also attached to the contact 144 by a third solder joint 134 arranged between the second contact region 144 and the contact 114.

As shown in FIG. 1A, the first contact region 142 has a convex shape which faces towards the first main 120_1 side of the semiconductor die 120 such that a distance between the first main side 120_1 and the first contact region 142 increases from a base 146 of the convex shape towards an edge 148 of the first contact region 142.

The carrier 110 may be any suitable carrier that may mechanically and electrically coupled to a semiconductor die and may e.g. comprise a leadframe, a DCB (direct copper bonding), a DAB (direct aluminum bonding), an AMB (active metal brazing) substrate, or a PCB (printed circuit board). The die pad 112 may comprise an essentially flat upper surface facing the semiconductor die 120. The contact 114 may denote an (outer) contact of the semiconductor device 100. The carrier 110 may also be configured to dissipate heat generated by the semiconductor die 120.

The semiconductor die 120 may comprise a vertical transistor structure with a first electrode (e.g. a source electrode) arranged on the first main side 120_1 and coupled to the contact clip 140 and a second electrode (e.g. a drain electrode) arranged on the second main side 120_2 and coupled to the die pad 112. Furthermore, a third electrode (e.g. a gate electrode) may e.g. be arranged on the first main side 120_1 (not shown in FIG. 1). The semiconductor die 120 may e.g. be a power semiconductor die configured to handle high currents and/or high voltages.

The semiconductor die 120 may have any suitable length 1, for example a length 1 (compare FIG. 1B) of more than 3 mm, more than 5 mm, more than 10 mm, more than 15 mm, or more than 20 mm.

The contact clip 140 may be configured to couple the semiconductor die (e.g. the first electrode) to the contact 114. The contact clip 140 may further be configured to dissipate heat generated by the semiconductor die 120.

Providing a large first contact region 142 and a large second solder joint 132 which covers a substantial part of the first main side 120_1 of the semiconductor die 120 may help to provide a good electrical and thermal coupling between the semiconductor die 120 and the contact clip 140. Likewise, providing a first solder joint 130 which completely or almost completely covers the second main side 120_2 of the semiconductor die 120 may help to provide a good electrical and thermal coupling between the semiconductor die 120 and the die pad 112.

Figure 1B:
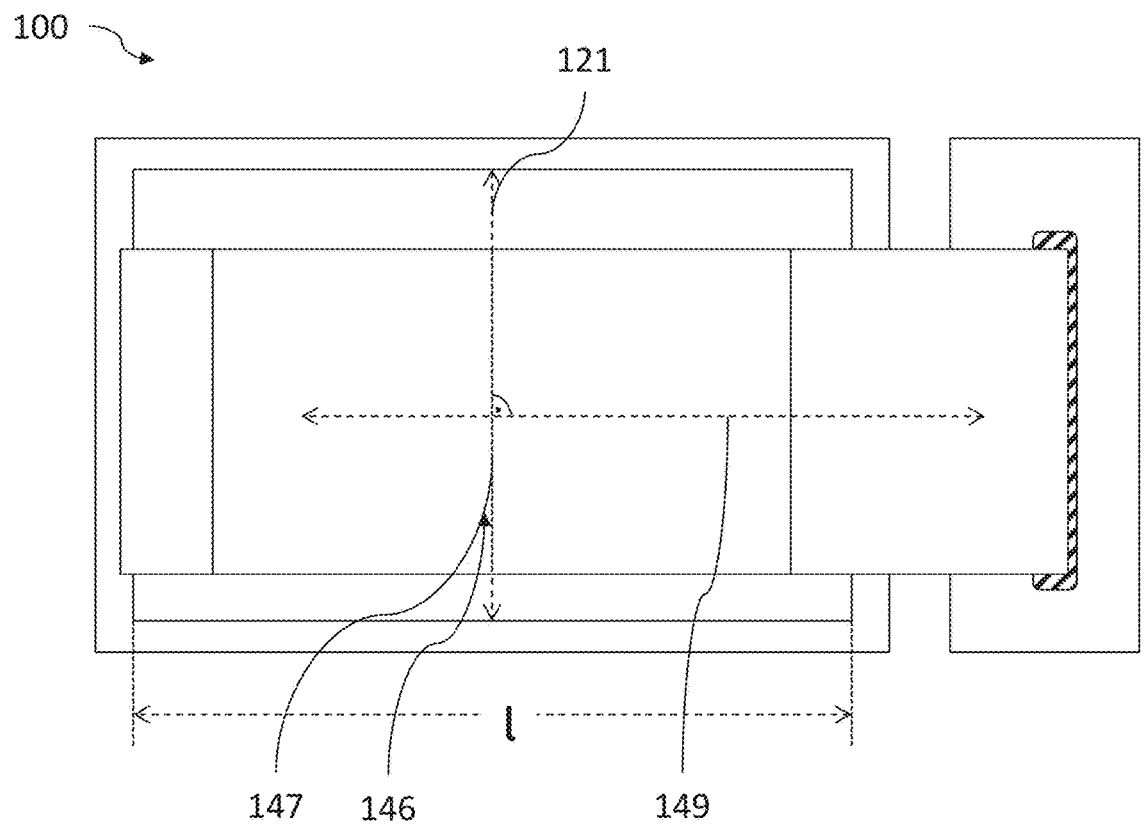
FIG. 1B shows a top-down view of the first example of a semiconductor device.

FIG. 1B shows a top-down view of the semiconductor device 100 of FIG. 1A. As shown in FIG. 1B, the base 146 runs along a line (indicated by the dashed line 147) that is substantially perpendicular to a longitudinal axis 149 of the contact clip 140. Furthermore, the base 146 (indicated by the line 147) may coincide with a center axis 121 of the semiconductor die 120 within a margin of error of 200 µm, or 150 µm, or 100 µm, or less.

The above-described arrangement of the base 146 may have the positive effect that the weight of the contact clip 140 pressing down on the semiconductor die 120 (especially during a soldering process while the second solder joint 132 and possibly also the first solder joint 130 is in a fluid state) is distributed along the center axis 121 of the semiconductor die 120. This way, an asymmetric pressure onto the semiconductor die 120 (i.e. a downwards pressure on the left or on the right of the center axis 121) and the first solder joint 130 is avoided. During soldering such an asymmetric pressure could cause a tilt of the semiconductor die 120 such that the first solder joint 130 is thicker at one edge and thinner at the opposite edge of the semiconductor die 130. This will be explained in more detail further below.

The second contact region 144 of the contact clip 140 shown in FIG. 1A and FIG. 1B comprises a bent-down end portion 145 which connects the first contact region 142 with the second contact region 144. The bent-down end portion 145 may comprise a cut surface, wherein the cut surface faces the contact 114. Due to manufacturing tolerances the bent-down end portion 145 may be manufactured too long in some cases or too short in other cases which may cause the contact clip 140 to be arranged over the semiconductor die 120 tilted to the left or to the right, respectively. However, the convex shape of the first contact region 142 with the base 146 arranged along the center axis 121 of the semiconductor die 120 may help to prevent an asymmetric pressure from being exerted onto the semiconductor die 120 as mentioned above.

Furthermore, the fact that the base 146 runs along the line 147 which is perpendicular to the longitudinal axis 149 of the contact clip 140 may allow the contact clip 140 to rotate around the line 147 during soldering of the second solder joint 132 but at the same time prevents a rotation of the contact clip 140 around the longitudinal axis 149. Therefore, after a hardening of the second solder joint 132 the contact clip 140 may be attached to the semiconductor die 120 free of a tilt around the longitudinal axis.

According to an example, the contact clip 140 does not comprise the bent-down end portion 145 but instead the second contact region 144 is arranged at an end of a straight portion 143 of the contact clip 140. In this case the first contact region 142 and the second contact region 144 of the contact clip 140 may essentially be straight. Such a contact clip 140 may e.g. be used in the case that the contact 114 comprises an upwards-bent portion on which the third solder joint is arranged.

The example of FIG. 1A shows a thickness of the second solder joint 132 directly beneath the base 146 of the convex shape of the contact clip 140 to be zero or essentially zero. In other words, the base 146 may be in direct contact with the first main side 120_1 of the semiconductor die 120. However, according to another example it is also possible that the second solder joint 132 has a nonzero thickness beneath the base 146 such that the base 146 is not in direct contact with the first main side 120_1.

Figure 2A:
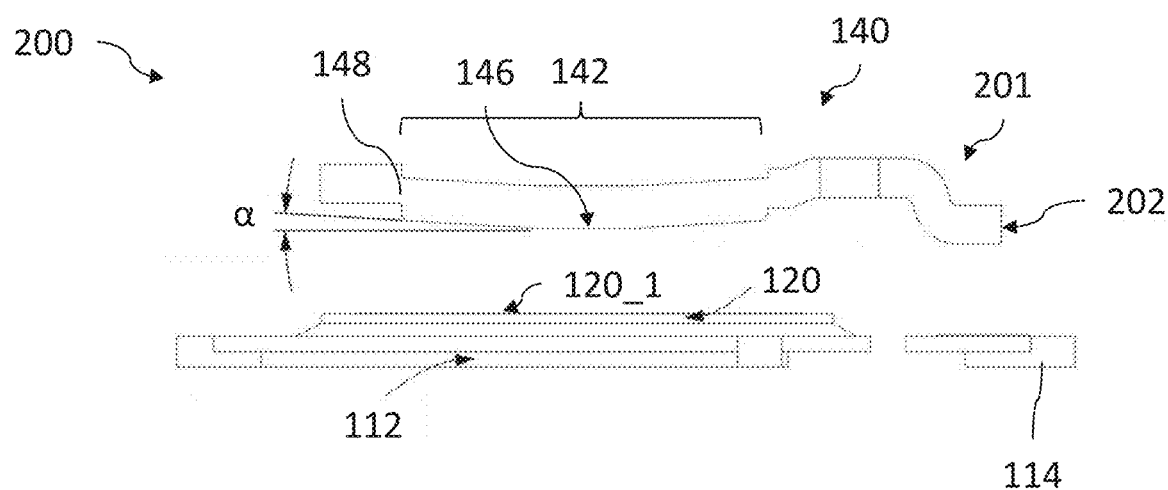
FIG. 2A shows a side view of a second example of a semiconductor device that comprises a different contact clip geometry compared to the first example.

FIG. 2A shows a side view of a semiconductor device 200 in a stage of fabrication before the contact clip 140 is arranged on the semiconductor die 120. The semiconductor device 200 may be similar or identical to the semiconductor device 100 and identical reference signs may denote similar or identical parts.

Semiconductor device 200 differs from semiconductor device 100 in the form of the second contact region 201 which has a gull wing shape (also called a cranked shape). A cut surface 202 at the second contact region 201 does not face the contact 114 as in the semiconductor device 100 but instead is arranged perpendicular on the contact 114.

FIG. 2A furthermore shows a tilt angle α between the first main side 120_1 of the semiconductor die 120 and the contact clip 140. The convex shape of the first contact region 142 may in particular be a V-shape, wherein a leg of the V-shape (between the base 146 and the edge 148) is essentially straight. The tilt angle α may be delimited by the leg of the V-shape and the first main side 120_1. The tilt angle α may be in the range of 3° to 20° and may be about 5°, 7°, 10°, 12°, or 15°.

A tilt angle α smaller than 3° may be difficult to manufacture and/or may not provide the advantages described further above. A tilt angle α of much more than 20° may make it difficult to provide a second solder joint 132 (compare FIG. 1A) that covers essentially the whole first main side 120_1 of the semiconductor die 120. However, a second solder joint 132 with a smaller lateral extension may have poorer electrical, mechanical and/or thermal characteristics.

Figure 2B:
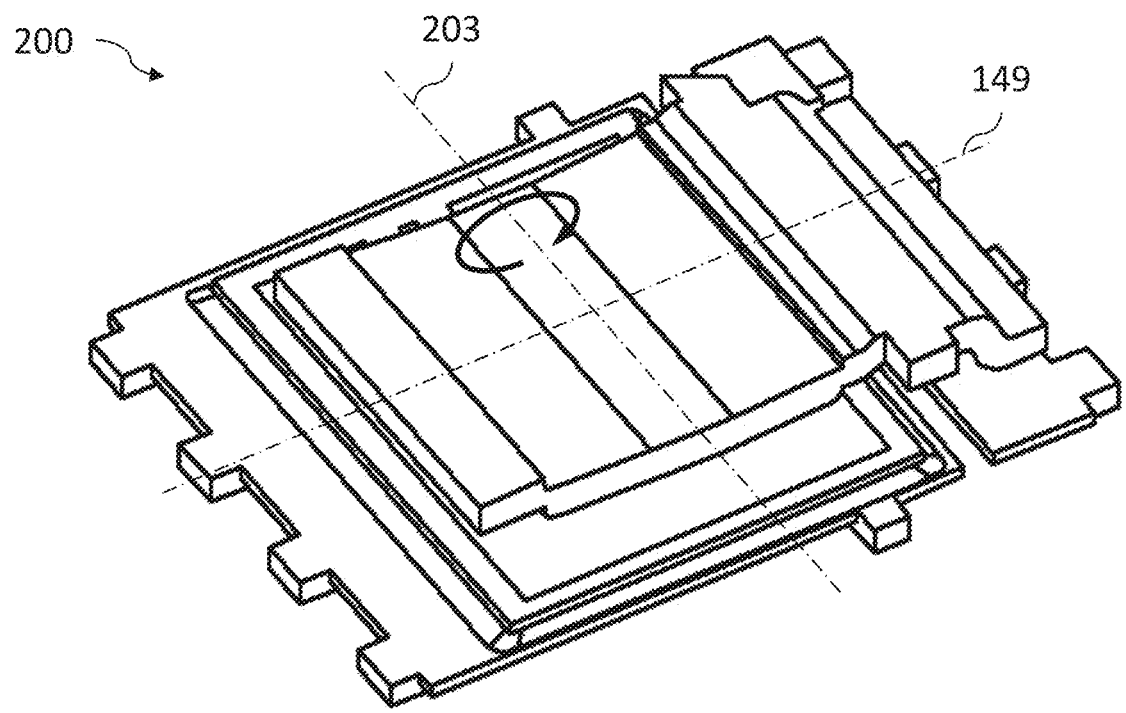
FIG. 2B shows a perspective view of the second example of a semiconductor device.

FIG. 2B shows a perspective view of the semiconductor device 200 after the contact clip 140 has been arranged on the semiconductor die 120. FIG. 2B in particular shows that the convex shape of the first contact region 142 as described above allows a rotation of the contact clip 140 around the transversal axis 203 (i.e. the line 147), at least as long as the solder of the second solder joint 132 is fluid. However, a rotation around the longitudinal axis 149 is prevented as already mentioned above. This may prevent the contact clip 140 from developing a tilt around the longitudinal axis during soldering of the second solder joint 132.

Figure 3A:
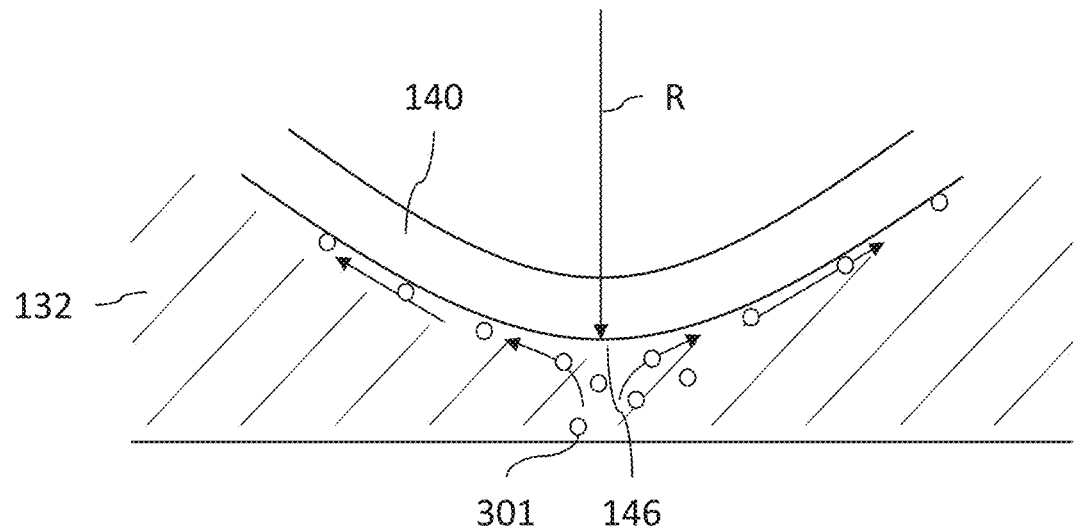
FIG. 3A shows a detailed side view of a section of the semiconductor device of FIG. 1 according to an example.

FIG. 3A shows a detail view of the section A in FIG. 1A. According to an example, the base 146 of the contact clip 140 has a rounded shape as shown in FIG. 3A. The convex shape of the first contact region 142 may e.g. be fabricated using a pressing tool or a stamping tool. It may not be possible to press or stamp the contact clip 140 such that a base 146 with a sharp edge is obtained. Therefore, the base 146 may have a rounded shape with a certain radius of curvature R. The radius of curvature R may for example be in the range of 30 µm to 200 µm, in particular 50 µm to 150 µm. The rounded shape of the base 146 may advantageously reduce a stress that is exerted onto the semiconductor die 120 by the contact clip 140 because the weight of the contact clip 140 is distributed over a certain area.

FIG. 3A shows gas bubbles 301 which may occur in the solder material of the second solder joint 132 during soldering (e.g. in a reflow oven). In the case that these gas bubbles 301 are unable to exit the solder material while it is still fluid, they will cause voids in the second solder joint 132 after hardening of the solder material. Such voids may reduce the electrical conductivity and/or mechanical robustness of the second solder joint 132.

However, the convex shape of the contact clip 140 may help to remove the gas bubbles 301 from the solder material during soldering because the gas bubbles may rise upwards and outwards along the convex shape out of the solder material (this is indicated by the arrows in FIG. 3A). A convex shape (e.g. a V-shape) that is monotonically increasing, in particular monotonically increasing continuously as shown in FIG. 3A may be ideal for this purpose. In this way, the occurrence of voids in the second solder joint 132 may be reduced or even completely eliminated.

Figure 3B:
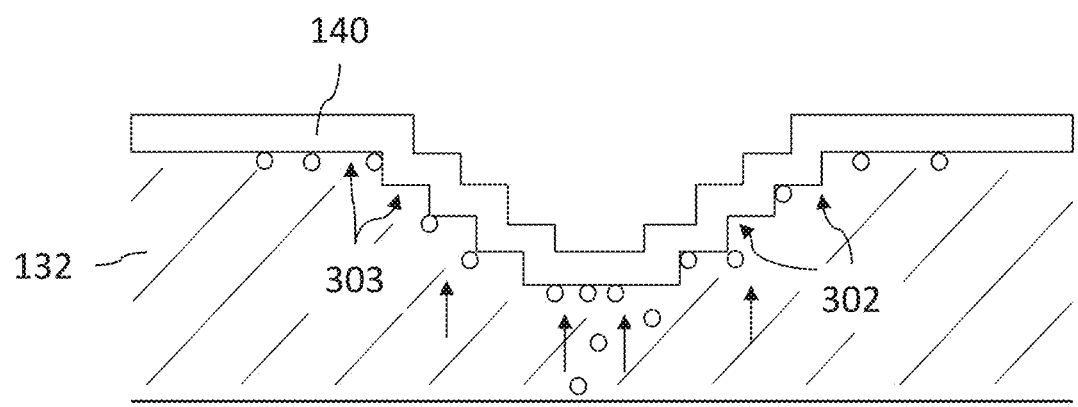
FIG. 3B shows a detailed side view of the section of FIG. 1 according to another example.

FIG. 3B shows an example of a contact clip 140, wherein the convex shape is comprised of a series of steps such that a surface curvature of the convex shape comprises a plurality of discontinuities or jags 302. Rising gas bubbles 301 may agglomerate at these discontinuities or jags 302 due to surface tension. Furthermore, the gas bubbles 301 may also agglomerate at the flat portions 303 of the stepped convex shape because they are not guided towards an edge of the second solder joint 132 by a rising surface of the contact clip 140. A contact clip 140 with a stepped convex shape as shown in FIG. 3B may therefore be unsuited for the efficient removal of the gas bubbles 301 and may therefore be prone to void formation in the second solder joint 132.

Figure 4:
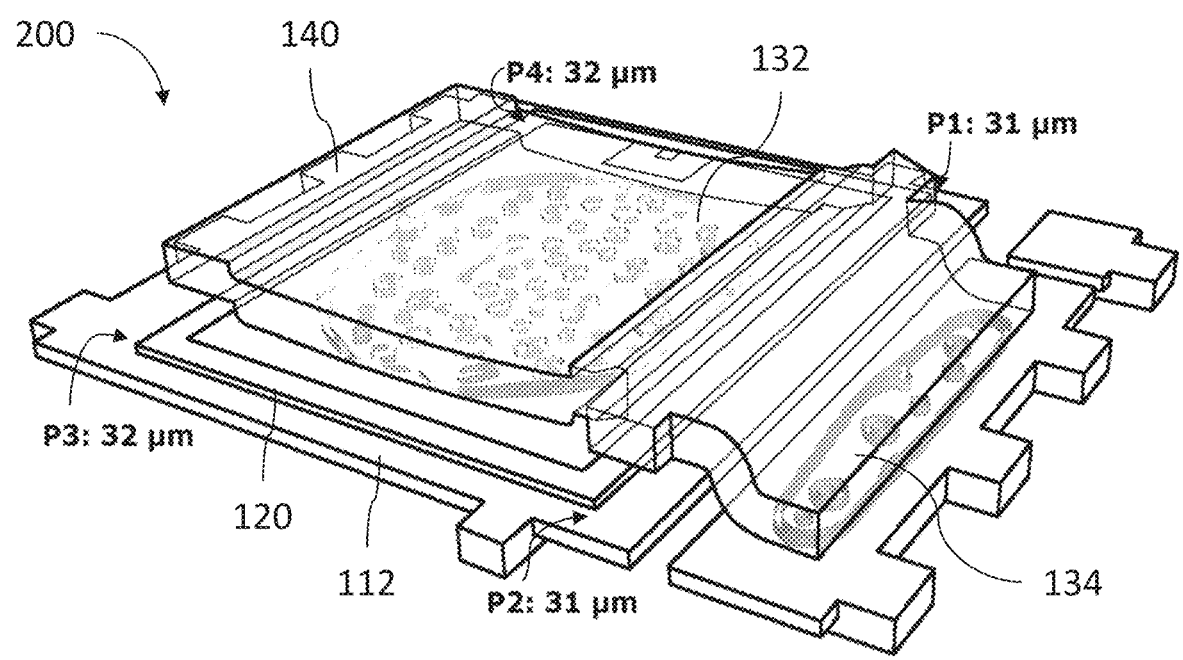
FIG. 4 shows a perspective view of the second example of a semiconductor device with exemplary thickness values of a first solder joint.

FIG. 4 shows a perspective view of the semiconductor device 200. According to an example, the first, second and third solder joints 130, 132 and 134 are soldered simultaneously, e.g. by reflow soldering. The contact clip 140 weighs on the center axis 121 of the semiconductor die 120 (compare FIG. 1B) such that an asymmetric pressure on the semiconductor die 120 and the first solder joint 130 is avoided. This way, the first solder joint 130 connecting the semiconductor die 120 to the die pad 112 may be fabricated with a very homogeneous thickness. FIG. 4 shows an example, wherein the thickness of the first solder joint 130 at the four corners P1-P4 of the semiconductor die 120 is 31 µm to 32 µm. In general, a tolerance range of the thickness of the first solder joint 130 in the semiconductor devices 100, 200 at the four corners P1-P4 may be smaller than 10 µm, smaller than 7 µm, smaller than 5 µm, smaller than 2 µm and even about 1 µm or less.

Figure 5:
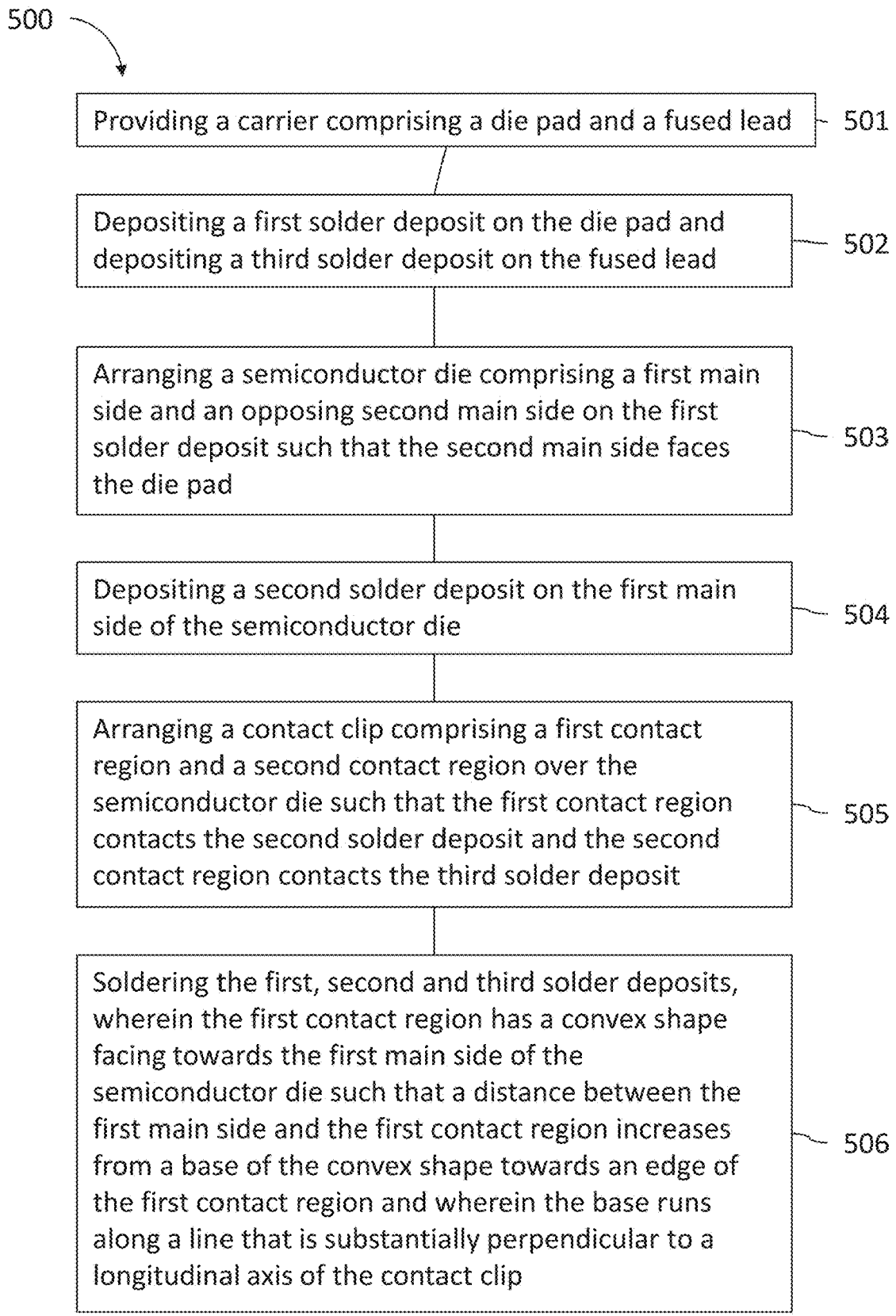
FIG. 5 shows a flow chart of a method for fabricating a semiconductor device.

FIG. 5 shows a flow chart of a method 500 for fabricating a semiconductor device. The method 500 may for example be used to fabricate the semiconductor device 100 or 200.

The method 500 comprises a first act 501 of providing a carrier comprising a die pad and a contact, a second act 502 of depositing a first solder deposit on the die pad and depositing a third solder deposit on the contact, a third act 503 of arranging a semiconductor die comprising a first main side and an opposing second main side on the first solder deposit such that the second main side faces the die pad, a fourth act 504 of depositing a second solder deposit on the first main side of the semiconductor die, a fifth act 505 of arranging a contact clip comprising a first contact region and a second contact region over the semiconductor die such that the first contact region contacts the second solder deposit and the second contact region contacts the third solder deposit and a sixth act 506 of soldering the first, second and third solder deposits. According to the method 500, the first contact region has a convex shape facing towards the first main side of the semiconductor die such that a distance between the first main side and the first contact region increases from a base of the convex shape towards an edge of the first contact region. Furthermore, according to method 500 the base runs along a line that is substantially perpendicular to a longitudinal axis of the contact clip.

According to an example, the method 500 further comprises that the first, second and third solder deposits are soldered simultaneously. Such a simultaneous soldering may for example be done in a reflow process.

EXAMPLES

In the following the semiconductor device and the method for fabricating a semiconductor device will be further explained based on specific examples.

A first example is a semiconductor device comprising a carrier comprising a die pad and a contact, a semiconductor die comprising a first main side and an opposing second main side, the semiconductor die being attached to the die pad by a first solder joint such that the second main side faces the die pad and a contact clip comprising a first contact region and a second contact region, the first contact region being attached to the first main side of the semiconductor die by a second solder joint and the second contact region being attached to the contact by a third solder joint, wherein the first contact region has a convex shape facing towards the first main side of the semiconductor die such that a distance between the first main side and the first contact region increases from a base of the convex shape towards an edge of the first contact region and wherein the base runs along a line that is substantially perpendicular to a longitudinal axis of the contact clip.

A second example is the semiconductor device of the first example, wherein the distance is monotonically increasing from the base towards the edge.

A third example is the semiconductor device of the second example, wherein the distance is monotonically increasing continuously.

A fourth example is the semiconductor device of one of the preceding examples, wherein the line coincides with a center axis of the semiconductor die within a margin of error of 200 µm, or 150 µm, or 100 µm or less.

A fifth example is the semiconductor device of one of the preceding examples, wherein the base has a rounded shape.

A sixth example is the semiconductor device of one of the preceding examples, wherein a surface curvature of the first contact region is free of discontinuities.

A seventh example is the semiconductor device of one of the preceding examples, wherein the convex shape is a V-shape.

An eight example is the semiconductor device of example 7, wherein a tilt angle between the first main side of the semiconductor die and a leg of the V-shape is in the range of 3° to 15°.

A ninth example is the semiconductor device of one of the preceding examples, wherein the second contact region of the contact clip has a gull wing shape.

A tenth example is the semiconductor device of one of the examples 1 to 8, wherein the second contact region of the contact clip comprises a bent-down end portion comprising a cut surface and wherein the cut surface faces the contact.

An eleventh example is the semiconductor device of one of the examples 1 to 8, wherein the first contact region and the second contact region of the contact clip are essentially straight.

A twelfth example is the semiconductor device of one of the preceding examples, wherein the first solder joint is flat such that a vertical distance of the second main side of the semiconductor die to the die pad is within a margin of error of 15 µm, or 10 µm, or 5 µm, or 2 µm or less.

A thirteenth example is a method for fabricating a semiconductor device, wherein the method comprises providing a carrier comprising a die pad and a contact, depositing a first solder deposit on the die pad and depositing a third solder deposit on the contact, arranging a semiconductor die comprising a first main side and an opposing second main side on the first solder deposit such that the second main side faces the die pad, depositing a second solder deposit on the first main side of the semiconductor die, arranging a contact clip comprising a first contact region and a second contact region over the semiconductor die such that the first contact region contacts the second solder deposit and the second contact region contacts the third solder deposit and soldering the first, second and third solder deposits, wherein the first contact region has a convex shape facing towards the first main side of the semiconductor die such that a distance between the first main side and the first contact region increases from a base of the convex shape towards an edge of the first contact region and wherein the base runs along a line that is substantially perpendicular to a longitudinal axis of the contact clip.

A fourteenth example is the method of example 13, wherein the first, second and third solder deposits are soldered simultaneously.

A fifteenth example is the method of example 13 or example 14, wherein the distance is monotonically increasing from the base towards the edge.

A sixteenth example is the method of example 15, wherein the distance is monotonically increasing continuously.

A seventeenth example is the method of one of examples 13 to 16, wherein the line coincides with a center axis of the semiconductor die within a margin of error of 200 µm, or 150 µm, or 100 µm or less.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a carrier comprising a die pad and a contact;
   a semiconductor die comprising a first main side and an opposing second main side, the semiconductor die being attached to the die pad by a first solder joint such that the second main side faces the die pad; and
   a contact clip comprising a first contact region and a second contact region, the first contact region being attached to the first main side of the semiconductor die by a second solder joint and the second contact region being attached to the contact by a third solder joint,
   wherein the first contact region has a convex shape facing towards the first main side of the semiconductor die such that a distance between the first main side and the first contact region increases from a base of the convex region towards an edge of the first contact region,
   wherein the base runs along a line that runs substantially perpendicular to a longitudinal axis of the contact clip.

2. The semiconductor device of claim 1, wherein the distance monotonically increases from the base towards the edge.

3. The semiconductor device of claim 2, wherein the distance monotonically increases continuously from the base towards the edge.

4. The semiconductor device of claim 1, wherein the line coincides with a center axis of the semiconductor die within a margin of error of 200 µm or less.

5. The semiconductor device of claim 1, wherein the second contact region of the contact clip comprises a bent-down end portion comprising a cut surface, and wherein the cut surface faces the contact.

6. The semiconductor device of claim 1, wherein the first contact region and the second contact region of the contact clip are straight.

7. The semiconductor device of claim 1, wherein the first solder joint is flat such that a vertical distance of the second main side of the semiconductor die to the die pad is within a margin of error of 15 μm or less.

\* \* \* \* \*